(12) United States Patent
Wildeson et al.

(10) Patent No.: US 11,152,539 B2
(45) Date of Patent: Oct. 19, 2021

(54) REDUCING OR ELIMINATING NANOPIPE DEFECTS IN III-NITRIDE STRUCTURES

(71) Applicant: Lumileds LLC, San Jose, CA (US)

(72) Inventors: Isaac Harshman Wildeson, San Jose, CA (US); Patrick Nolan Grillot, San Jose, CA (US); Tigran Nshanian, San Jose, CA (US); Parijat Pramil Deb, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/843,143

(22) Filed: Apr. 8, 2020

(65) Prior Publication Data

US 2020/0235263 A1    Jul. 23, 2020

Related U.S. Application Data

(60) Continuation of application No. 16/190,955, filed on Nov. 14, 2018, now Pat. No. 10,651,340, which is a
(Continued)

(51) Int. Cl.
*H01L 33/12* (2010.01)
*H01L 33/00* (2010.01)
(Continued)

(52) U.S. Cl.
CPC ............ *H01L 33/12* (2013.01); *H01L 25/167* (2013.01); *H01L 27/0248* (2013.01); *H01L 33/007* (2013.01); *H01L 33/0025* (2013.01); *H01L 33/0075* (2013.01); *H01L 33/0093* (2020.05); *H01L 33/0095* (2013.01); *H01L 33/025* (2013.01); *H01L 33/06* (2013.01); *H01L 33/20* (2013.01); *H01L 33/305* (2013.01); *H01L 33/32* (2013.01); *H01L 33/325* (2013.01); *H01L 33/62* (2013.01); *H01S 5/3086* (2013.01);
(Continued)

(58) Field of Classification Search
CPC ...................................................... H01L 33/12
See application file for complete search history.

(56) References Cited

U.S. PATENT DOCUMENTS

| | | |
|---|---|---|
| 6,054,716 A | 4/2000 | Sonobe et al. |
| 6,194,742 B1 | 2/2001 | Kern et al. |

(Continued)

FOREIGN PATENT DOCUMENTS

| | | |
|---|---|---|
| DE | 102009060749 A1 | 7/2011 |
| EP | 1255281 A2 | 6/2002 |

(Continued)

OTHER PUBLICATIONS

EPO as ISA, "International Search Report and Written Opinion" dated Nov. 27, 2013 from International Application No. PCT/182013/055446, filed Jul. 3, 2013, 12 pages.

(Continued)

*Primary Examiner* — Douglas M Menz
(74) *Attorney, Agent, or Firm* — Servilla Whitney LLC

(57) ABSTRACT

Embodiments of the invention include a III-nitride light emitting layer disposed between an n-type region and a p-type region, a III-nitride layer including a nanopipe defect, and a nanopipe terminating layer disposed between the III-nitride light emitting layer and the III-nitride layer comprising a nanopipe defect. The nanopipe terminates in the nanopipe terminating layer.

12 Claims, 4 Drawing Sheets

Related U.S. Application Data continuation of application No. 15/193,624, filed on Jun. 27, 2016, now Pat. No. 10,193,015, which is a division of application No. 14/413,233, filed as application No. PCT/IB2013/055446 on Jul. 3, 2013, now Pat. No. 9,406,836.

(60) Provisional application No. 61/670,257, filed on Jul. 11, 2012.

(51) Int. Cl.

| | | |
|---|---|---|
| *H01L 33/02* | (2010.01) | |
| *H01L 33/32* | (2010.01) | |
| *H01L 33/06* | (2010.01) | |
| *H01L 33/20* | (2010.01) | |
| *H01L 33/30* | (2010.01) | |
| *H01L 33/62* | (2010.01) | |
| *H01L 25/16* | (2006.01) | |
| *H01L 27/02* | (2006.01) | |
| *H01S 5/30* | (2006.01) | |
| *H01S 5/323* | (2006.01) | |

(52) U.S. Cl.
CPC ............... *H01S 5/32341* (2013.01); *H01L 2224/48095* (2013.01); *H01L 2224/73265* (2013.01)

(56) References Cited

U.S. PATENT DOCUMENTS

| | | |
|---|---|---|
| 6,447,604 B1 | 9/2002 | Flynn et al. |
| 6,555,846 B1 | 4/2003 | Waranabe et al. |
| 7,312,480 B2 | 12/2007 | Hata et al. |
| 7,385,225 B2 | 6/2008 | Koyama |
| 7,462,876 B2 | 12/2008 | Han et al. |
| 8,465,997 B2 | 6/2013 | Okuno |
| 8,592,840 B2 | 11/2013 | Matthias et al. |
| 8,735,938 B2 | 5/2014 | Ooshika et al. |
| 8,993,416 B2 | 3/2015 | Yui et al. |
| 2007/0069253 A1 | 3/2007 | Sazawa et al. |
| 2009/0315067 A1 | 12/2009 | Huang et al. |
| 2011/0012089 A1 | 1/2011 | Khan et al. |
| 2011/0272670 A1 | 11/2011 | Kawaguchi et al. |
| 2011/0309327 A1 | 12/2011 | Jeong |
| 2012/0126293 A1 | 5/2012 | Sumiya et al. |
| 2012/0211765 A1 | 8/2012 | Miyoshi et al. |

FOREIGN PATENT DOCUMENTS

| | | |
|---|---|---|
| JP | H09148625 A | 6/1997 |
| JP | 2000277803 A | 10/2000 |
| JP | 2000332293 A | 11/2000 |
| JP | 2000353821 A | 12/2000 |
| JP | 2001077412 A | 3/2001 |
| JP | 2007129011 A | 5/2007 |
| JP | 2010225881 A | 10/2010 |
| KR | 100665364 B1 | 1/2007 |
| KR | 20110107666 A | 10/2011 |
| KR | 20120049371 A | 5/2012 |
| TW | 201001743 A | 1/2010 |
| TW | 201135976 A | 10/2011 |
| TW | 201228026 A1 | 7/2012 |
| WO | 99/25030 A1 | 5/1999 |

OTHER PUBLICATIONS

First Office Action dated Oct. 8, 2016, China Patent Application No. 201380036760.1, 18 pages.
JP Office Action dated May 23, 2017, Japan Patent Application No. 2015-521107, 8 pages.
Liliental-Weber et al., "Comparison between structural properties of bulk GaN grown in liquid GA under high N pressure and GaN grown by other methods", Journal of Crystal Growth, 246, 2002, pp. 259-270.
Liliental-Weber et al., "Formation Mechanism of Nanotubes in GaN", Physical Review Letters, vol. 79, No. 15, Oct. 13, 1997, p. 2835-2838.
Second Office Action dated Aug. 2, 2017, China Patent Application No. 201380036760.1, 16 pages.
TW Office Action dated Feb. 8, 2017, Taiwan Application No. 102124946, 9 pages.
TW Office Action; dated Jun. 20, 2017. Taiwan Patent Application No. 102124946, 11 pages.

REDUCING OR ELIMINATING NANOPIPE DEFECTS IN III-NITRIDE STRUCTURES

CROSS-REFERENCE TO RELATED APPLICATIONS

The present application is a continuation of U.S. patent application Ser. No. 16/190,955 filed on Nov. 14, 2018, titled "REDUCING OR ELIMINATING NANOPIPE DEFECTS IN III-NITRIDE STRUCTURES", which is continuation of U.S. patent application Ser. No. 15/193,624 filed on Jun. 27, 2016, titled "REDUCING OR ELIMINATING NANOPIPE DEFECTS IN III-NITRIDE STRUCTURES", which is a divisional of U.S. patent application Ser. No. 14/413,233 filed on Jan. 7, 2015, titled "REDUCING OR ELIMINATING NANOPIPE DEFECTS IN III-NITRIDE STRUCTURES", which is a § 371 application of International Application No. PCT/IB2013/055446 filed on Jul. 3, 2013, which claims priority to U.S. Provisional Patent Application No. 61/670,257 filed on Jul. 11, 2012.

FIELD OF THE INVENTION

The present invention relates to reducing or eliminating nanopipe defects in III-nitride structures.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often grown on sapphire, Si, or SiC substrates. Due to differences in lattice constant and coefficient of thermal expansion between the substrate material and the III-nitride semiconductor material, defects are formed in the semiconductor during growth, which may limit the efficiency of III-nitride devices.

SUMMARY

It is an object of the invention to reduce or eliminate nanopipe defects in a III-nitride structure.

Embodiments of the invention include a III-nitride light emitting layer disposed between an n-type region and a p-type region, a III-nitride layer including a nanopipe defect, and a nanopipe terminating layer disposed between the III-nitride light emitting layer and the III-nitride layer comprising a nanopipe defect. The nanopipe terminates in the nanopipe terminating layer.

Embodiments of the invention include a III-nitride light emitting layer disposed between an n-type region and a p-type region, and a III-nitride layer that may be doped with an acceptor. The n-type region is disposed between the III-nitride layer doped with an acceptor and the light emitting layer. The acceptor may be, for example, magnesium.

A method according to embodiments of the invention includes growing a III-nitride layer over a growth substrate, the III-nitride layer including a nanopipe defect, growing a nanopipe terminating layer over the III-nitride layer, and growing a III-nitride light emitting layer over the nanopipe terminating layer. The nanopipe terminates in the nanopipe terminating layer.

DETAILED DESCRIPTION

Figure 1:
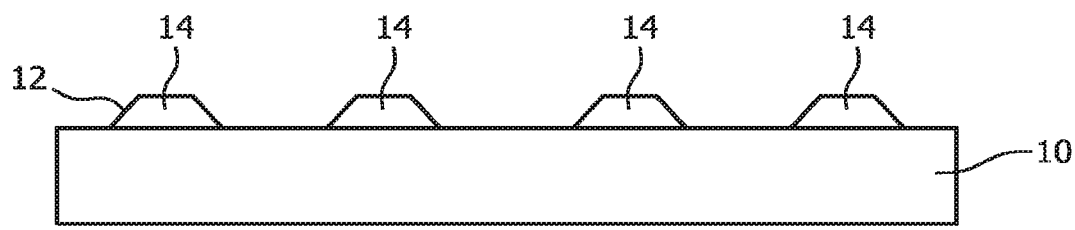
FIG. 1 illustrates a III-nitride nucleation layer grown on a substrate.
Figure 2:
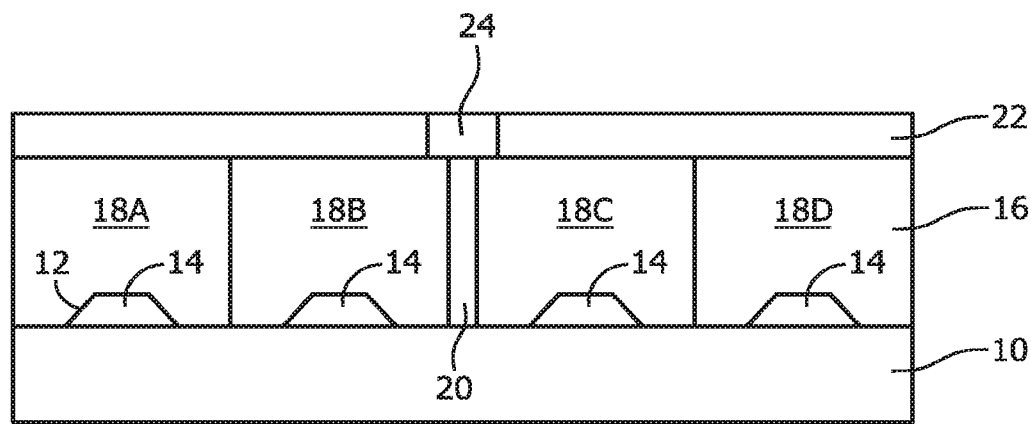
FIG. 2 illustrates the formation of a nanopipe in a high temperature layer and an active region grown over the structure illustrated in FIG. 1.

FIGS. 1 and 2 illustrate the formation of a type of defect referred to herein as a nanopipe. Nanopipes are particularly problematic defects because of their large size—often several microns long, and several tens or hundreds of angstroms in diameter. For example, in III-nitride material a nanopipe may be at least 10 Å wide in some embodiments and no more than 500 Å wide in some embodiments. In some materials, such as SiC, nanopipes may be 1 micron wide, or even wider. Nanopipes may be caused by impurities such as oxygen, silicon, magnesium, aluminum, and indium in GaN films. Nanopipes may also be related to impurities or defects on the substrate surface, such as scratches, or nanopipes may be present in the substrate itself, and may continue from the substrate into the III-nitride material grown on the substrate. Nanopipes often form in III-nitride devices at a density of ~$10^6$ cm$^{-2}$, which is much lower than the dislocation density in typical III-nitride devices, which may vary from ~$10^7$ cm$^{-2}$ to ~$10^{10}$ cm$^{-2}$.

In FIG. 1, a low temperature nucleation layer 12, often GaN or AlN, is deposited on a substrate 10, which may be, for example, sapphire, SiC, Si, a composite substrate, or any other suitable substrate. Nucleation layer 12 is often a polycrystalline or amorphous layer, deposited at a temperature less than 800° C., for example. The nucleation layer 12 is then annealed at a temperature higher than the deposition temperature. When the nucleation layer 12 is annealed, the nucleation layer forms small separated islands 14 of the nucleation layer on the substrate.

In FIG. 2, a high temperature III-nitride layer 16, often GaN, is grown over nucleation layer 12 to decrease the density of threading dislocations in the device, and to create a smooth, uniform surface on which the active region and other device layers may be grown. High temperature layer 16 initially nucleates on the islands 14, resulting in individual islands 18A, 18B, 18C, and 18D, which eventually coalesce into a smooth, uniform film. Most of the boundaries between islands coalesce to form a smooth uniform film, but these boundaries, such as the boundary between islands 18A and 18B or the boundary between islands 18C and 18D, may contain one or more dislocations, thus giving rise to a threading dislocation density $\sim 10^7$ cm$^{-2}$ to $\sim 10^{10}$ cm$^2$. While most of the islands coalesce, gaps remain between some islands, and these gaps form long narrow defects commonly referred to as nanopipes. One such nanopipe 20 is illustrated in FIG. 2 between islands 18B and 18C. In III-nitride devices such as LEDs, a light emitting or active region 22 is grown above the high temperature layer 16. Nanopipe 20 may propagate near or into active region 22 to form a damaged area 24. These damaged areas in the active region can lead to poor LED performance and poor reliability, and are thus undesirable.

Figure 3:
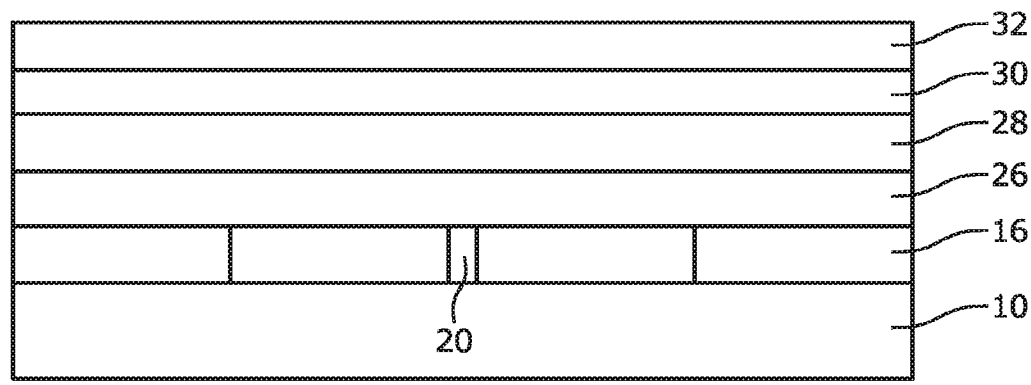
FIG. 3 illustrates a III-nitride structure including a nanopipe termination structure.

In embodiments of the invention, a structure that prevents a nanopipe from propagating into a later-grown layer, or that reduces the size of the nanopipe, referred to herein as a "nanopipe termination structure" or NTS, is grown before the active region. FIG. 3 illustrates a III-nitride structure including an NTS. In FIG. 3, a high temperature layer 16, often an undoped or n-type GaN layer, is grown over a nucleation layer (not shown) on a substrate, as described above in FIGS. 1 and 2. The high temperature layer may include one or more nanopipes 20. An NTS 26 is grown over high temperature layer 16, which includes nanopipes 20. At least a part of NTS 26 may be not intentionally doped, doped with acceptors such as magnesium, or doped with donors such as Si.

An n-type region 28 is grown over NTS 26, followed by active region 30, followed by a p-type region 32. Examples of suitable light emitting regions 30 include a single thick or thin light emitting layer, or a multiple quantum well light emitting region including multiple thin or thick light emitting layers separated by barrier layers. The light emitting layers in active region 30, in a device that emits visible light, are typically InGaN. The light emitting layers in active region 30, in a device that emits UV light, may be GaN or AlGaN. Each of the n-type region 28 and the p-type region 32 may include multiple layers of different composition, thickness, and dopant concentration, including layers that are not intentionally doped, or layers of the opposite conductivity type. In one example, n-type region 28 includes at least one n-type GaN layer doped with Si, active region 30 includes InGaN quantum well layers separated by GaN barrier layers, and p-type region 32 includes at least one p-type GaN or AlGaN layer doped with Mg.

In some embodiments, NTS 26 is a low temperature GaN layer. For example, a low temperature GaN NTS may be grown at a temperature approximately 100 to 200° C. below the growth temperature of high temperature GaN layer 16. This low temperature GaN NTS may be at least 10 nm thick in some embodiments, no more than 40 nm thick in some embodiments, 25 nm thick in some embodiments, at least 100 nm thick in some embodiments, no more than 1 micron thick in some embodiments, and 0.5 micron thick in some embodiments. The low temperature GaN layer is a substantially single crystal layer, and it may be doped or undoped.

In some embodiments, NTS 26 is a III-nitride layer that includes aluminum, such as AlN, AlGaN, AlBGaN, or AlInGaN. The composition x in an $Al_xGa_{1-x}N$ NTS may be at least 0.1 in some embodiments, no more than 0.5 in some embodiments, at least 0.2 in some embodiments, and no more than 0.3 in some embodiments. In one example, an $Al_xGa_{1-x}N$ NTS layer is 150 Å thick at x=0.25. The upper limit on thickness and composition are determined by the cracking threshold for growth of AlGaN on GaN, so AlN may be used if NTS 26 is sufficiently thin to avoid cracking. As a result, the maximum allowable thickness decreases as the Al composition increases. The thickness of an aluminum-containing NTS may be at least 50 Å thick in some embodiments, no more than 0.5 μm thick in some embodiments, at least 100 Å thick in some embodiments, and no more than 500 Å thick in some embodiments. An aluminum-containing NTS may be undoped or doped with an acceptor such as magnesium. In some embodiments, the aluminum-containing layer includes at least some minimal thickness that is not doped with Si, or is not doped n-type. For example, this minimal thickness is at least 2 nm in some embodiments and at least 5 nm in some embodiments.

In some embodiments, NTS 26 is a III-nitride layer doped with acceptor defects. Magnesium is the preferred acceptor, although other acceptor defects may also be used. Other potential candidates for these acceptor defects include carbon, beryllium, or native defects. A magnesium-doped NTS 26 may be, for example, any suitable III-nitride material including GaN, InGaN, AlGaN, or AlInGaN. In some embodiments, a magnesium-doped NTS 26 may be grown immediately after annealing nucleation layer 12, such that high temperature layer 16, which is often undoped, is omitted. The magnesium concentration may range from $1\times10^{17}$ cm$^{-3}$ to $1\times10^{20}$ cm$^{-3}$ in some embodiments and from $1\times10^{17}$ cm$^{-3}$ to $1\times10^{19}$ cm$^{-3}$ in some embodiments. The magnesium dopants in this layer do not need to be activated after growth.

In some embodiments, the concentration of magnesium in a magnesium-doped NTS 26 is graded. As used herein, the term "graded" when describing the dopant concentration in a layer or layers in a device is meant to encompass any structure that achieves a change in dopant concentration in any manner other than a single step in composition. Each graded layer may be a stack of sublayers, each of the sublayers having a different dopant concentration than either sublayer adjacent to it. If the sublayers are of resolvable thickness, the graded layer is a step-graded layer. In some embodiments, the sublayers in a step-graded layer may have a thickness ranging from several tens of angstroms to several thousands of angstroms. In the limit where the thickness of individual sublayers approaches zero, the graded layer is a continuously-graded region. The sublayers making up each graded layer can be arranged to form a variety of profiles in dopant concentration versus thickness, including, but not limited to, linear grades, parabolic grades, and power-law grades. Also, graded layers or graded regions are not limited to a single grading profile, but may include portions with different grading profiles and one or more portions with substantially constant dopant concentration. For example, in a graded magnesium-doped NTS 26, the magnesium concentration may increase in a linear fashion as the NTS 26 is grown, such that the concentration of magnesium is higher in a portion of NTS 26 closer to the active region than in a portion of NTS 26 further from the active region.

Figure 4:
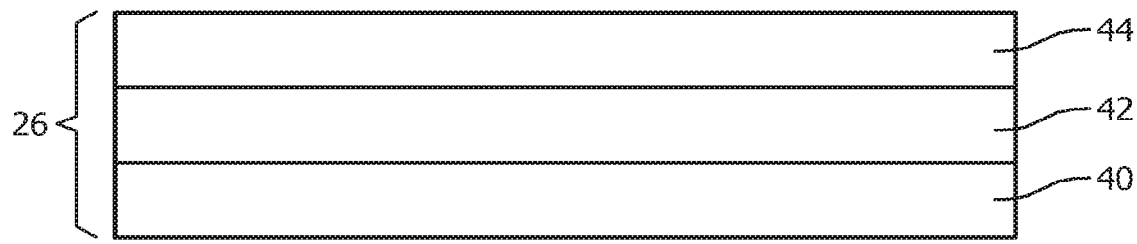
FIG. 4 illustrates a nanopipe termination structure including multiple acceptor-doped layers.
Figure 5:
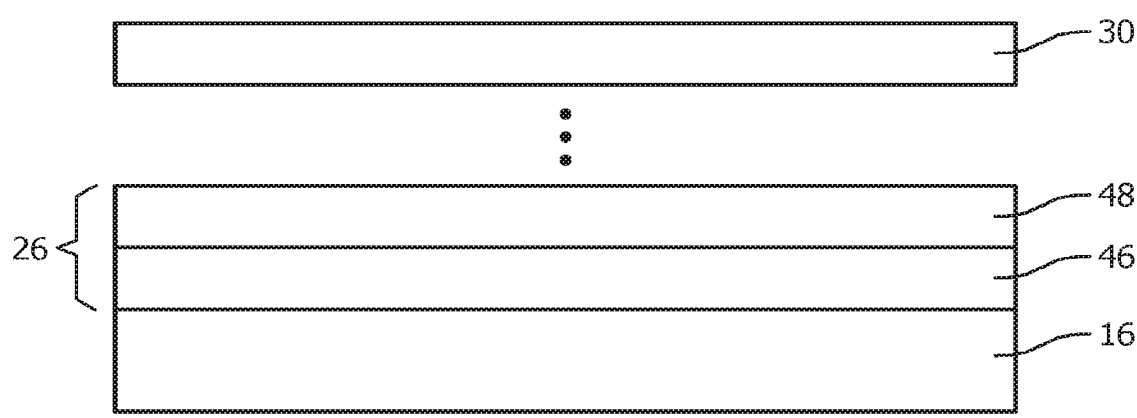
FIG. 5 illustrates a nanopipe termination structure including an acceptor-doped layer and an additional layer.
Figure 6:
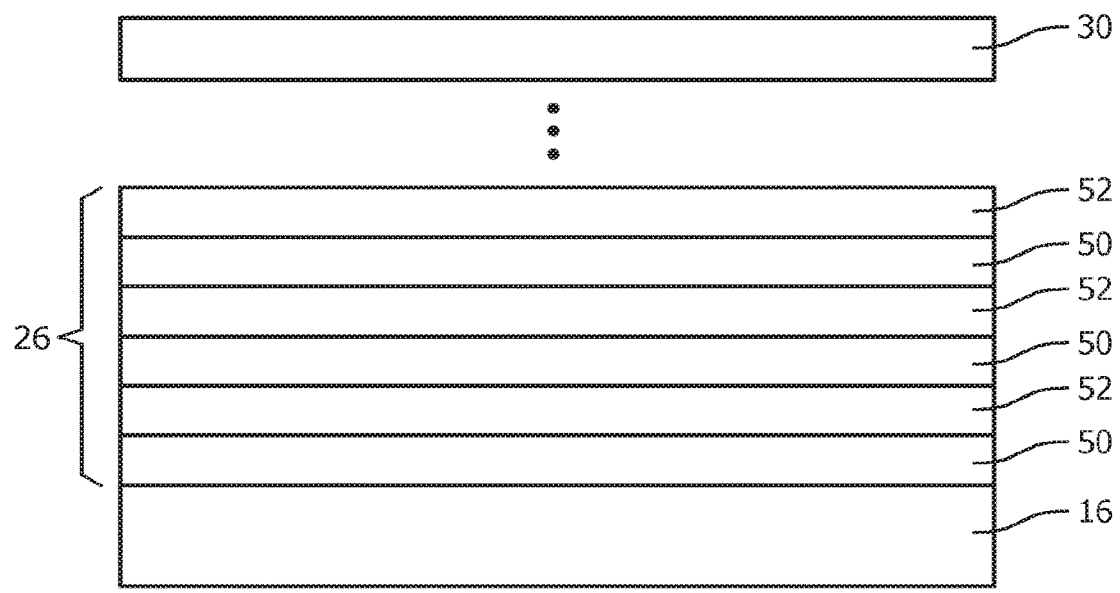
FIG. 6 illustrates a superlattice nanopipe termination structure.

In some embodiments, NTS 26 includes multiple layers. FIGS. 4, 5, and 6 illustrate nanopipe termination structures with multiple layers.

FIG. 4 illustrates an NTS 26 with multiple layers doped with magnesium or any other suitable acceptor. Each of layers 40, 42, and 44 may have a different dopant concentration. For example, layer 40 may have a magnesium concentration between zero (not doped with Mg) and $2 \times 10^{18}$ cm$^{-3}$, layer 42 may have a magnesium concentration between $1 \times 10^{17}$ cm$^{-3}$ and $1 \times 10^{20}$ cm$^{-3}$ in some embodiments and between $2 \times 10^{17}$ cm$^{-3}$ and $5 \times 10^{19}$ cm$^{-3}$ in some embodiments, and layer 44 may have a magnesium concentration between zero (not doped with Mg) and $1 \times 10^{19}$ cm$^{-3}$. The layer in NTS 26 closest to active region 30 may have the highest dopant concentration in some embodiments. The layer in NTS 26 closest to growth substrate 10 may have the lowest dopant concentration in some embodiments. Though FIG. 4 illustrates three layers, an NTS with multiple acceptor-doped layers may include more or fewer than three layers. Layers 40, 42, and 44 may have the same composition, though they need not. For example, layers 40, 42, and 44 may be GaN, InGaN, AlGaN, AlN, or AlInGaN.

In FIG. 5, NTS 26 includes at least two layers 46 and 48. Layer 46 is grown on high temperature, nanopipe-containing layer 16. Layer 46 may be doped with magnesium or another acceptor. Layer 46 is often GaN, although it may be InGaN, AlGaN, or AlInGaN. Layer 48 is grown over layer 46. Layer 48 may include aluminum and/or indium. For example, layer 48 may be AlGaN, InGaN, or AlInGaN. Alternatively, layer 48 may be a GaN layer grown at a temperature 100 to 200° C. below the temperature of high temperature layer 16. The low temperature GaN layer may be doped or undoped. An active region 30 is grown over layer 48. Active region 30 may be grown in direct contact with layer 48, or may be spaced apart from layer 48 by, for example, an n-type region 28 as illustrated in FIG. 3.

In FIG. 6 NTS 26 is a superlattice. The superlattice may be doped or undoped. The superlattice includes multiple pairs of layers 50 and 52. Layers 50 and 52 alternate. Though three layer pairs are illustrated, more or fewer layer pairs can be used. An active region 30 is grown over the super lattice. Active region 30 may be grown in direct contact with the superlattice, or may be spaced apart from the superlattice by, for example, an n-type region 28 as illustrated in FIG. 3. Though the superlattice is illustrated beginning with a layer 50 in direct contact with high temperature layer 16 and terminating with a layer 52 disposed beneath active region 30, the superlattice may begin or terminate with either a layer 50 or a layer 52, and the superlattice may include incomplete layer pairs. In one embodiment, layers 50 are GaN and layers 52 are $Al_aGa_{1-a}N$ with an aluminum composition a between 0.05 and 1. In one embodiment, layers 50 are GaN and layers 52 are AlN. In some embodiment, layers 50 are $Al_bGa_{1-b}N$ and layers 52 are $Al_cGa_{1-c}N$, where b≠c in one embodiment, b>c in some embodiments, and b<c in some embodiments. In one embodiment, layers 50 and 52 may have compositions b=0.05 and c=1. Strain compensated layer pairs may also be used, where one of the layers 50 and 52 is compressively strained, such as by using InGaN or another indium containing layer, and the other of layers 50 and 52 is under tensile strain, such as by using AlGaN, AlN, or AlInGaN. Each of layers 50 and 52 may be, for example, at least 1 nm thick in some embodiments and no more than 50 nm thick in some embodiments. The total thickness of the superlattice may be at least 10 nm thick in some embodiments and no more than 1000 nm thick in some embodiments.

In some embodiments, NTS 26 is spaced apart from active region 30. For example, NTS 26, which may be any of the NTSs described above, may be spaced apart from the active region 30 by n-type region 28. NTS 26 may be spaced at least 500 nm from the active region 30 in some embodiments, at least 1 micron from the active region 30 in some embodiments, and no more than 5 microns from the active region 30 in some embodiments. NTS 26 is grown before the active region of the device, such that NTS 26 is included in the template on which the active region 30 is grown. After growth, the orientation may be maintained, such that the NTS is located below the active region, or the device may be flipped over, such that the NTS is located above the active region.

In some embodiments, the active region is disposed between an n-type region and a p-type region. Metal contacts are formed on the n- and p-type regions in order to forward bias the active region. In some embodiments, no metal contacts are formed on the NTS such that the NTS is not intentionally electrically active in the device, meaning that the NTS is not in the direct path of electrons and holes flowing through the semiconductor structure from the contacts. Some current may inadvertently flow into or through the NTS in some embodiments.

Figure 7:
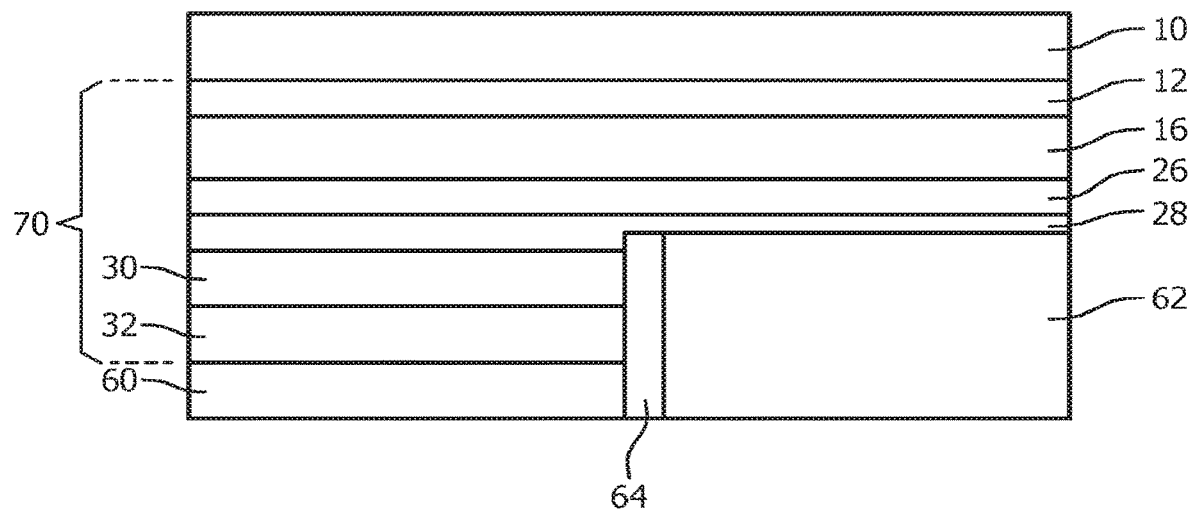
FIG. 7 illustrates the structure of FIG. 3 formed into a flip chip device.

The semiconductor structures illustrated in FIGS. 3, 4, 5, and 6 may be formed into any appropriate device. FIG. 7 illustrates one example of an appropriate device, a flip chip. The semiconductor structure 70 may include one or more of a nucleation layer 12, high temperature layer 16, NTS 26, n-type region 28, active region 30, and p-type region 32, and may include any combination of these structures or features of these structures described above. A metal p-contact 60 is formed on the p-type region. If a majority of light is directed out of the semiconductor structure through a surface opposite the p-contact, the p-contact 60 may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact 62 is formed. The p- and n-contacts are electrically isolated from each other by a gap 64, which may be filled with a dielectric material. The mesa and p- and n-contacts may be formed in any suitable manner. Forming the mesa and p- and n-contacts is well known to a person of skill in the art. Substrate 10 may be removed or thinned, or may remain part of the device, as illustrated in FIG. 7. If substrate 10 is removed, any or all of nucleation layer 12, high temperature layer 16, and NTS 26 may be removed or thinned.

Figure 8:
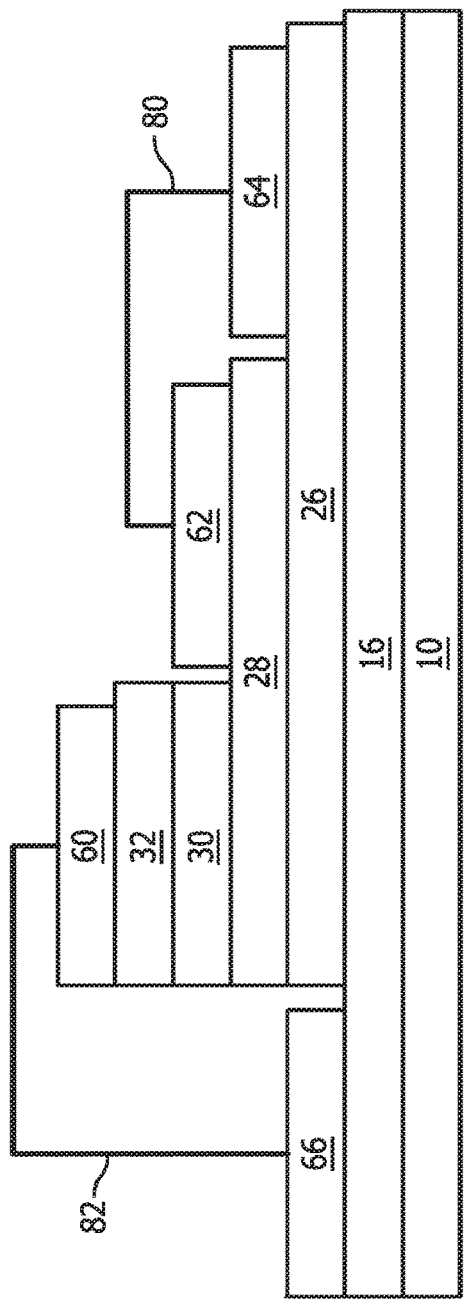
FIG. 8 illustrates a nanopipe termination structure incorporated into an electrostatic discharge protection circuit.
Figure 9:
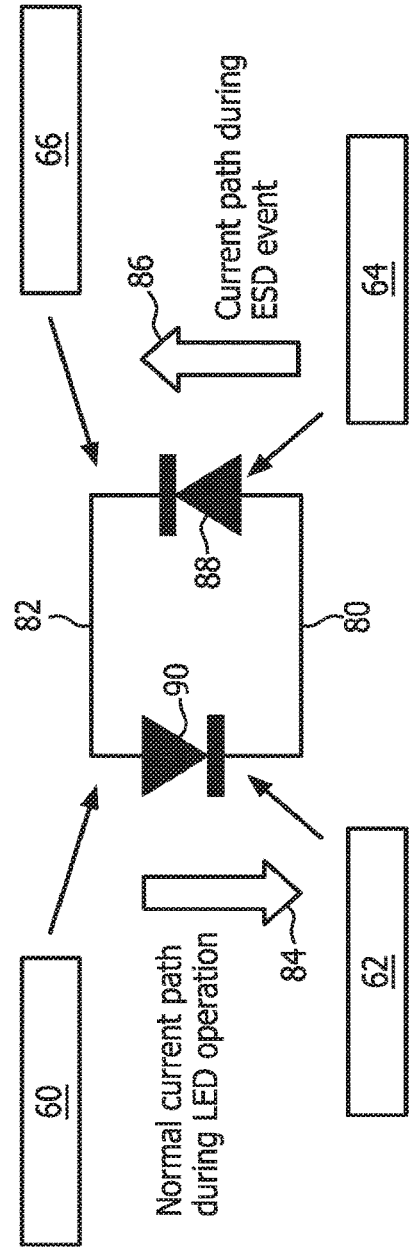
FIG. 9 is a circuit diagram of the structure illustrated in FIG. 8.

In some embodiments, metal contacts may be formed on both the NTS and the high temperature region, such that the NTS may form part of a secondary electrical protection circuit, such as an electrostatic discharge protection circuit. FIG. 8 illustrates a cross section of a device including an NTS that forms part of an electrostatic discharge protection circuit. FIG. 9 is a circuit diagram of the structure illustrated in FIG. 8. In the device of FIGS. 8 and 9, the NTS 26 is electrically connected to the n-type region 28, and the p-type region 32 is electrically connected to the high temperature layer 16, such that the NTS 26 and high temperature layer 16 form an electrostatic discharge (ESD) protection diode connected anti-parallel to the diode formed by the n-type and p-type regions 28 and 32 that surround the active region 30. First and second metal contacts 64 and 66 are formed on NTS 26 and high temperature layer 16 respectively, as illustrated in FIG. 8. Mesas, in addition to the mesa which exposes the n-type region on which contact 62 is formed, may be etched to expose NTS 26 on which contact 64 is formed, and to expose high temperature layer 16 on which contact 66 is formed. The electrical connection 80 between contacts 62 and 64 and the electrical connection 82 between contacts 60 and 66 may be metal layers formed on the chip with appropriate dielectric isolation layers, or may be formed on a mount through external circuitry.

The LED in FIGS. 8 and 9 includes n-type region 28, active region 30, and p-type region 32. The LED is forward biased by applying current to metal contacts 60 and 62, electrically connected to p-type region 32 and n-type region 28, respectively. The ESD protection diode includes high temperature layer 16 and NTS 26, which are connected to metal contacts 66 and 64, respectively.

FIG. 9 is a circuit diagram of the device illustrated in FIG. 8. LED 90 and electrostatic discharge protection diode 88 are illustrated in FIG. 9. Arrow 84 illustrates current flow during normal LED operation. Arrow 86 illustrates current flow during an electrostatic discharge event.

Though in the examples below the semiconductor light emitting device are III-nitride LEDs that emits blue or UV light, semiconductor light emitting devices besides LEDs such as laser diodes may be within the scope of the invention.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
   a III-nitride structure disposed between an n-type region and a p-type region;
   a III-nitride layer comprising GaN islands coalesced into a smooth film, and a nanopipe defect disposed at a boundary between two GaN islands; and
   a nanopipe terminating layer that is doped with a donor disposed between the III-nitride structure and the III-nitride layer comprising the nanopipe defect, wherein the nanopipe terminates in the nanopipe terminating layer.

2. The device of claim 1 wherein the donor comprises Si.

3. The device of claim 1 wherein the III-nitride structure comprises a light emitting layer.

4. The device of claim 1 wherein the nanopipe terminating layer comprises aluminum.

5. The device of claim 1 wherein the nanopipe terminating layer comprises indium.

6. A device comprising:
   a III-nitride device structure;
   a III-nitride layer comprising GaN islands coalesced into a smooth film, and a nanopipe defect disposed at a boundary between two GaN islands; and
   a nanopipe termination layer disposed between the III-nitride device structure and the III-nitride layer comprising the nanopipe defect, wherein the nanopipe defect terminates in the nanopipe terminating layer.

7. The device of claim 6 wherein III-nitride structure comprises a light emitting layer.

8. The device of claim 6 wherein the nanopipe terminating layer comprises aluminum.

9. The device of claim 6 wherein the nanopipe terminating layer comprises indium.

10. The device of claim 6 wherein the nanopipe terminating layer is not intentionally doped.

11. The device of claim 6 wherein the nanopipe terminating layer is doped with an acceptor.

12. The device of claim 6 wherein the nanopipe terminating layer is doped with a donor.

* * * * *